(12) United States Patent
Uno et al.

(10) Patent No.: US 8,039,177 B2
(45) Date of Patent: Oct. 18, 2011

(54) METHOD OF CORRECTING A FLARE AND COMPUTER PROGRAM PRODUCT

(75) Inventors: Taiga Uno, Ibaraki (JP); Yukiyasu Arisawa, Ibaraki (JP); Hajime Aoyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/817,968

(22) Filed: Jun. 17, 2010

(65) Prior Publication Data

US 2010/0323282 A1    Dec. 23, 2010

(30) Foreign Application Priority Data

Jun. 19, 2009    (JP) ................................. 2009-146895

(51) Int. Cl.
*G03F 9/00*    (2006.01)
(52) U.S. Cl. ................................. 430/5; 430/30; 382/144
(58) Field of Classification Search ................ 430/5, 30; 382/144; 716/50, 51, 54, 55
See application file for complete search history.

(56) References Cited

U.S. PATENT DOCUMENTS

| 6,625,802 | B2 | 9/2003 | Singh et al. |
| 6,815,129 | B1 | 11/2004 | Bjorkholm et al. |
| 6,898,781 | B2 | 5/2005 | Singh et al. |
| 7,234,130 | B2 | 6/2007 | Word et al. |

FOREIGN PATENT DOCUMENTS

| JP | 2007-524255 | 8/2007 |
| WO | WO2005/082063 A2 | 9/2005 |

*Primary Examiner* — Christopher Young

(74) *Attorney, Agent, or Firm* — Finnegan, Henderson, Farabow, Garrett & Dunner, L.L.P.

(57) ABSTRACT

A method of correcting a flare comprising: calculating a distribution of a flare value corresponding to pattern data on the pattern data as a flare map; calculating an occupancy of a pattern having a predetermined flare value on the pattern data as a flare value occupancy for each flare value, by using the flare map; determining a reference flare value to be a reference of the flare value based on the distribution of the flare value occupancy; and performing a pattern correction corresponding to the flare value with a pattern correction amount at the reference flare value as a reference.

20 Claims, 13 Drawing Sheets

FLARE VALUE

FLARE VALUE

FIG.15

| | WITHOUT REFERENCE | REFERENCE 4.2 % |
|---|---|---|
| CORRECTION CHANGE RATE | 4.3 % | 0.2 % |

START
↓
INPUT PSF — S110
↓
CALCULATE FLARE MAP — S120
↓
EXTRACT CRITICAL PATTERN — S130
↓
CALCULATE FLARE AREA OCCUPANCY — S140
↓
DETERMINE REFERENCE FLARE VALUE — S150
↓
PERFORM PATTERN CORRECTION — S160
↓
END

|  | WITHOUT REFERENCE | REFERENCE 4.6 % |
|---|---|---|
| CORRECTION CHANGE RATE | 4.3 % | 0.19 % |

METHOD OF CORRECTING A FLARE AND COMPUTER PROGRAM PRODUCT

CROSS-REFERENCE TO RELATED APPLICATIONS

This application is based upon and claims the benefit of priority from the prior Japanese Patent Application No. 2009-146895, filed on Jun. 19, 2009; the entire contents of which are incorporated herein by reference.

BACKGROUND

1. Field

The embodiments of the present invention relates to a method of correcting a flare and a computer program product.

2. Description of the Related Art

A pattern formed by an exposure apparatus used in manufacturing a semiconductor integrated circuit has been miniaturized year by year. Therefore, it is expected that EUV (Extreme Ultra Violet) whose wavelength is shorter than ArF becomes a mainstream after a half-pitch (HP) 30 nm generation as exposure light used by the exposure apparatus. When the wavelength is $\lambda$ and an optical numerical aperture is NA, resolution is expressed by an expression $\lambda$/NA, and a finer pattern can be formed as this value is smaller. Thus, with the EUV, the resolution of an exposure transfer pattern can be increased due to wavelength-shortening, enabling to form a finer pattern than the ArF.

On the other hand, along with this wavelength-shortening, some changes from a conventional technology occur, such as a device configuration and an exposure method. A lens and a mask are cited as major change points. Conventionally, a refractive lens is used as a lens optical system; however, when exposure is performed using the EUV, exposure light does not penetrate through the refractive lens because of a relationship between light absorption and a refractive index, so that the conventional refractive lens cannot be used and a reflective optical system (mirror) needs to be used.

Moreover, as an exposure mask used for pattern transfer, a reflective mask needs to be used instead of a conventional transmissive mask in which a light shielding area is partially provided on a transparent substrate. This reflective mask is configured to include a reflective area for partially reflecting light so that a desired pattern is exposed on a resist and an absorptive area in which exposure light is prevented from reflecting.

Furthermore, in manufacturing the mirror, a mirror surface needs to be polished; however, the mirror cannot be finished to be completely flat, and concaves and convexes (roughness) are formed on the mirror surface. When such a mirror surface roughness is present, the exposure light radiated to the mirror is reflected diffusely on the mirror surface in the pattern exposure. Therefore, scattered light is radiated to an unintended area on a resist surface of a wafer and thus contrast is lowered to blur a pattern image, so that a finished pattern shape cannot be formed as desired. The scattered light exposing to an unintended area is called flare, which is one of the major factors of an accuracy degradation of the pattern shape in the EUV exposure patterning.

In order to solve the degradation of the pattern shape quality due to the effect of the flare, the pattern shape on the mask is deformed to cancel expansion and contraction of the pattern due to the effect of the flare. However, the flare occurs due to the scattered light (scattered reflection light) that is reflected on a peripheral pattern (reflection area) and the actual circuit pattern is complicated and does not have uniformity, so that a pattern correction corresponding to the arrangements of the peripheral patterns is needed at each correction portion.

In an OPC (Optical Proximity Correction), the pattern correction can be made by taking into account the peripheral pattern in the range (few microns: $10^{-6}$ m) of an OPE (Optical Proximity Effect). On the other hand, in the case of the flare, for calculating flare intensity with respect to a target pattern, because the flare is attributed to the roughness of the mirror as described above, it is needed to take into account the effect of the peripheral pattern in a long range of at least millimeter ($10^{-3}$ m) order. This is one of the major characteristics of an EUV flare correction. For correcting the effect in the long range, a simple correction of adding a correction amount that is predetermined with respect to the flare intensity is performed without dynamically performing a simulation, an iteration, or the like, which is a method that can be processed within a realistic time in view of a current computer processing capability.

Moreover, in the inventions described in U.S. Pat. No. 6,625,802 B2 (Intel) Sep. 23, 2003 (Feb. 1, 2002) and U.S. Pat. No. 6,898,781 B2 (Intel) May 24, 2005 (Jul. 30, 2003), an area of a circuit pattern layout is partitioned (called a grid) into predetermined intervals, and a density of the pattern is calculated for each partitioned area. Then, the calculated density and a PSF (Point Spread Function) are convolved to calculate the flare. At this time, a first flare value in the case of coarsely partitioning (coarse grid) an area in a predetermined distance or further and a second flare value in the case of finely partitioning (fine grid) an area up to the predetermined length are calculated. Then, the value obtained by summing the first flare value and the second flare value is determined as the flare value of the whole area. Moreover, there are described a method of finding a portion where the uniformity of the flare value is poor and a method of finding a portion where the uniformity of the flare value is poor and adding a dummy pattern to correct a flare uniformity.

Furthermore, in the invention described in Japanese Translation of PCT International Application No. 2007-524255, calculation of the flare intensity and the flare correction are performed. As the calculation of the flare intensity, first, a circuit pattern layout is partitioned and a brightness value (pattern density) of each partitioned area is calculated. Next, convolution is performed on each area by using the brightness value and a point spread function (for example, Gaussian or fractal function) to obtain the flare intensity. As the flare correction, an edge is biased to perform the flare correction.

Moreover, in the invention described in U.S. Pat. No. 6,815,129 B1 (EUV LLC) Nov. 9, 2004 (Sep. 26, 2000), the PSF is first determined and the PSF and an areal image of a mask pattern are convolved (convolution) to calculate the flare intensity. Next, a lookup table, in which a bias amount with respect to the flare intensity that is obtained by experiment or the like in advance is defined, is used and the bias amount (correction amount) corresponding to the flare intensity is added to the pattern, to perform the pattern correction (flare correction) to cancel the effect of the flare.

The technology described in Japanese Translation of PCT International Application No. 2007-524255 describes that the edge is biased in accordance with the flare intensity, and the technology described in U.S. Pat. No. 6,815,129 B1 (EUV LLC) Nov. 9, 2004 (Sep. 26, 2000) describes that an exposure experiment is performed by using a mask for the experiment or the like and the correction amount is calculated based on the result thereof. If a portion where there is no flare effect is set to a bias 0, a large correction amount needs to be added to the pattern at a portion having a high flare value. If the large correction amount is added to the pattern, an inter-pattern distance or a pattern width is shortened, which makes it difficult to perform a mask manufacturing or a mask inspection. Moreover, difference between a mask shape and a desired shape leads to various adverse effects such as that degradation of a correction accuracy occurs due to a flare value change along with change in the pattern density before and after correction and an accuracy degradation occurs due to a slight error of MEF estimation, and furthermore, the time required for the correction is increased due to increase of correction target areas and the amount of mask writing data is increased.

For avoiding such problems, there is a method of changing a reference flare value for which the correction amount is 0 so that the correction amount when performing the flare correction does not become large by adjusting an exposure dose or the like at the time of the exposure. However, the value to be set as the reference value is determined based on an empirical judgment by a user at the present stage, and a systematic setting method is not present.

In the technologies described in the above four patent documents, a correction reference is not changed and a method of determining the flare value to be the reference is not described. Therefore, with the technologies described in the above four patent documents, a problem arises that the flare correction cannot be performed accurately. Moreover, the layout of today's semiconductor circuits has become more complex along with miniaturization and multiple functions, so that it has become extremely difficult to determine the reference value by a user.

BRIEF SUMMARY OF THE INVENTION

A method of correcting a flare according to an embodiment of the present invention comprises: calculating a distribution of a flare value corresponding to pattern data on the pattern data as a flare map; calculating an occupancy of a pattern having a predetermined flare value on the pattern data as a flare value occupancy for each flare value, by using the flare map; determining a reference flare value to be a reference of the flare value based on the distribution of the flare value occupancy; and performing a pattern correction corresponding to the flare value with a pattern correction amount according to the difference value from the reference flare value regarded as a reference.

BRIEF DESCRIPTION OF THE DRAWINGS

FIG. 15 is a diagram illustrating an effect when a flare correction is performed by the flare correction method according to the first embodiment;

FIG. 16 is a flowchart illustrating a process procedure of a flare correction method according to a second embodiment;

DETAILED DESCRIPTION

A method of correcting a flare and a computer program product according to embodiments of this invention are explained in detail below with reference to the accompanying drawings. This invention is not limited to these embodiments.

First Embodiment

Figure 1:
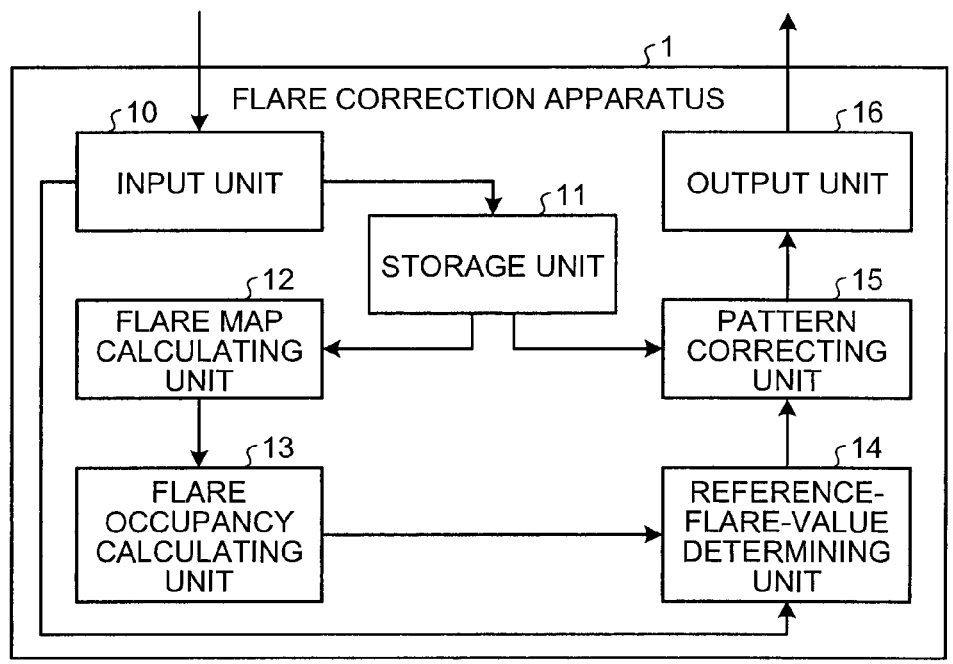
FIG. 1 is a diagram illustrating a configuration of a flare correction apparatus according to a first embodiment.

FIG. 1 is a diagram illustrating a configuration of a flare correction apparatus according to the first embodiment. A flare correction apparatus 1 is an apparatus, such as a computer, that performs a pattern correction (flare correction) to eliminate an effect of a flare.

The flare correction apparatus 1 in the present embodiment systematically determines a reference flare value (flare intensity to be a reference when performing the flare correction) for which a value 0 is set as a correction amount (flare correction amount) of a pattern (layout data) when performing the flare correction.

The flare correction apparatus 1 includes an input unit 10, a storage unit 11, a flare map calculating unit 12, a flare occupancy calculating unit 13, a reference-flare-value determining unit 14, a pattern correcting unit 15, and an output unit 16.

The input unit 10 inputs design layout data (layout data 4 to be described later) to be a target for the flare correction, a PSF (Point Spread Function) such as numerical data or a function that is used in calculation of a flare map, instruction information for specifying a calculation method of the reference flare value, and the like. The input unit 10 sends the layout data 4 and the PSF to the storage unit 11. Moreover, the input unit 10 sends the instruction information specifying the calculation method of the reference flare value to the reference-flare-value determining unit 14. The storage unit 11 is, for example, a memory that stores the layout data 4 and the PSF sent from the input unit 10.

The flare map calculating unit 12 performs calculation (flare calculation) of a flare map by using the layout data 4 and the PSF. The flare map is information on a distribution of the flare value on the layout data 4.

The flare occupancy calculating unit 13 calculates a pattern area occupancy (hereinafter, referred to as area occupancy) for each flare value divided for each predetermined flare value range. The area occupancy is information (flare value occupancy) indicating a ratio of an area of a pattern having each flare value with respect to the whole patterns in the layout data 4. In other words, the area occupancy is occupancy of the pattern having a predetermined flare value with respect to the whole area of the pattern data. The flare occupancy calculating unit 13 creates a distribution (histogram 81 to be described later), in which a level indicates the flare value and a frequency in each level (small section) (flare intensity section) indicates the area occupancy, by using the calculated area occupancy. Whereby, it is possible to quantitatively determine a degree of an area occupied by each flare value on the layout data 4. The flare occupancy calculating unit 13 can create a frequency distribution table corresponding to the histogram 81 instead of the histogram 81.

The reference-flare-value determining unit 14 analyzes the histogram 81 created by the flare occupancy calculating unit 13 and determines the reference flare value for which the flare correction value 0 is set. The reference-flare-value determining unit 14 in the present embedment, for example, determines the flare value with the highest area occupancy in the distribution of the flare value as the reference flare value.

The pattern correcting unit 15 performs a bias correction (pattern correction) of the layout data 4 with the reference flare value determined by the reference flare-value determining unit 14 as a reference. The output unit 16 outputs the corrected layout data of the layout data 4 by the pattern correcting unit 15 and/or the reference flare value determined by the reference-flare-value determining unit 14 to an external device or the like.

Figure 2:
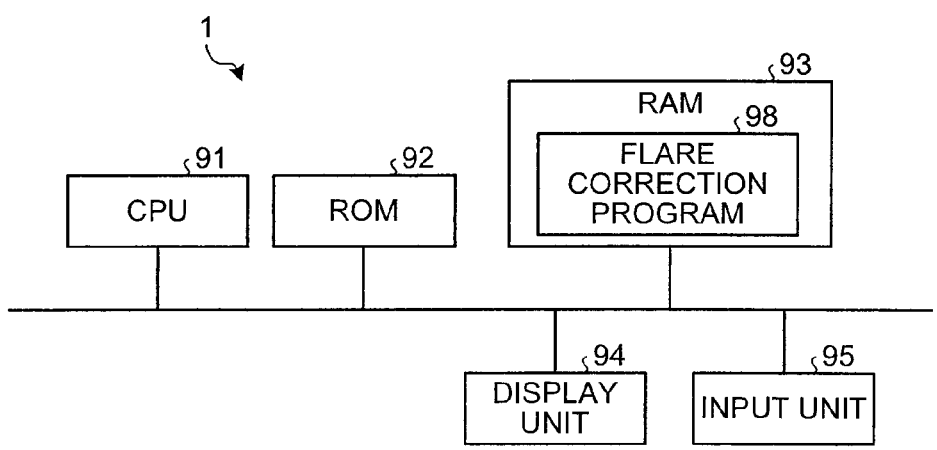
FIG. 2 is a diagram illustrating a hardware configuration of the flare correction apparatus.

FIG. 2 is a diagram illustrating a hardware configuration of the flare correction apparatus. The flare correction apparatus 1 is an apparatus that performs the flare correction on the layout data (layout data 4) of a photomask used in an exposure process in a semiconductor device manufacturing process, and includes a CPU (Central Processing Unit) 91, a ROM (Read Only Memory) 92, a RAM (Random Access Memory) 93, a display unit 94, and an input unit 95. In the flare correction apparatus 1, the CPU 91, the ROM 92, the RAM 93, the display unit 94, and the input unit 95 are connected via a bus line.

The CPU 91 executes the flare correction on the layout data 4 by using a flare correction program 98 that is a computer program that executes the flare correction on the layout data 4.

The display unit 94 is a display apparatus such as a liquid crystal monitor, and displays the layout data 4, the flare map, the flare occupancy, the reference flare value, the layout data 4 after the flare correction, and the like based on an instruction from the CPU 91. The input unit 95 includes a mouse and a keyboard, and inputs instruction information (such as parameters necessary for calculating the reference flare value) that is externally input by a user. The instruction information input to the input unit 95 is sent to the CPU 91.

The flare correction program 98 is stored in the ROM 92 and is loaded in the RAM 93 via the bus line. The CPU 91 executes the flare correction program 98 loaded in the RAM 93. Specifically, in the flare correction apparatus 1, the CPU 91 reads out the flare correction program 98 from the ROM 92, loads the flare correction program 98 in a program storage area in the RAM 93, and executes various processes, in accordance with the input of an instruction by a user from the input unit 95. The CPU 91 temporarily stores various data generated in the various processes in the data storage area formed in the RAM 93. It is sufficient that the flare correction program 98 is loaded in the RAM 93 at the time of the process, and the flare correction program 98 can be stored in a storage device (including a storage device connected to a network by wire or radio, such as CD, DVD, hard disk, and SSD) other than the ROM.

Figure 3:
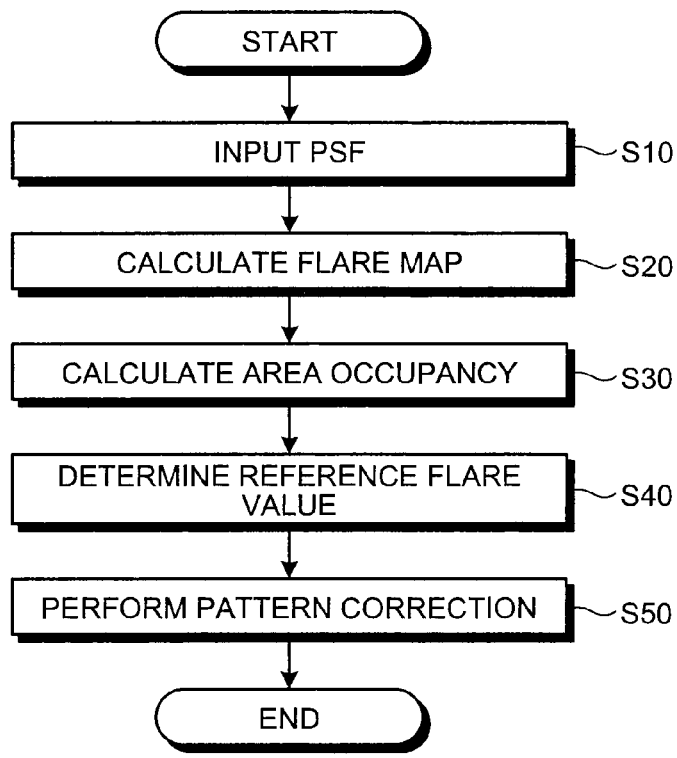
FIG. 3 is a flowchart illustrating a process procedure of a flare correction method according to the first embodiment.

Next, the method of correcting a flare (flare correction method) according to the first embodiment is explained. In the following explanation, a distance such as a pattern dimension is all described while being converted into a numerical value on a wafer surface. FIG. 3 is a flowchart illustrating a process procedure of the method of correcting a flare according to the first embodiment.

The layout data 4, the PSF, and the like are input in advance to the input unit 10 of the flare correction apparatus 1 (Step S10). The input unit 10 sends the layout data 4 and the PSF to the storage unit 11. The storage unit 11 stores the layout data 4 and the PSF sent from the input unit 10 in advance.

The flare map calculating unit 12 calculates the flare map by using the layout data 4 (Step S20). The flare map is a distribution in which a pattern data area is separated into mesh frames and the flare value corresponding to each mesh is stored. A calculation method of the flare map performed by the flare map calculating unit 12 can be any form, and a generally-known method for calculation of the flare map in a large-scale area is applied in the present embodiment. The flare map calculating unit 12, for example, calculates the flare map by convolving (convolution) a density map, in which the layout of the layout data 4 is divided into meshes and a pattern density is calculated, with the PSF. The PSF is numerical value data or a function that can obtain an exposure dose of the flare per unit area to be radiated to a center position in accordance with a distance.

Figure 4:
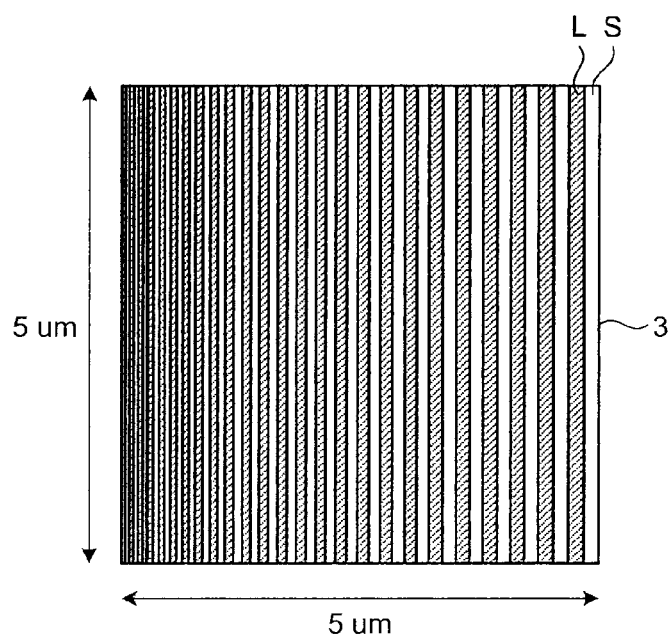
FIG. 4 is a top view illustrating part of layout data.

FIG. 4 is a top view illustrating part of the layout data. A line and space (L/S) pattern 3 shown in FIG. 4 is an example of a species cell repeatedly arranged in the layout data 4. The line and space pattern 3 is formed by alternately arranging a line L and a space S in a rectangular area of 5 μm×5 μm so that the line L is oriented in a predetermined direction. The line and space pattern 3 is arranged such that the leftmost end in the drawing is the line L and the space S of 40 nm and a line width (dimension of the line L) and an interval (dimension of the space S) are increased in increments of 5 nm in a right direction.

Figure 5:
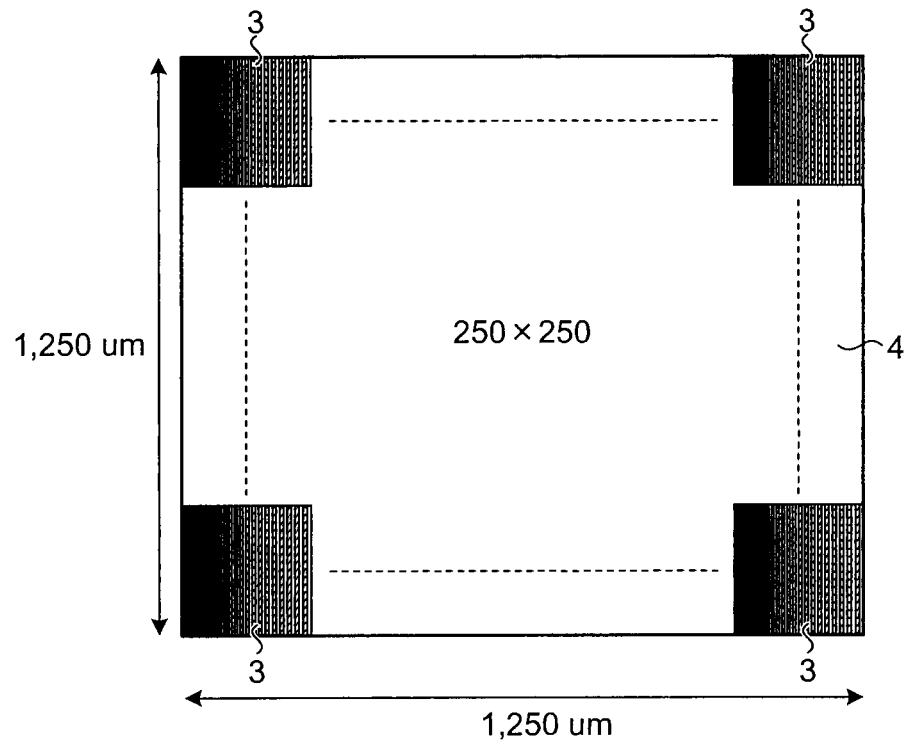
FIG. 5 is a diagram illustrating an example of the layout data.

FIG. 5 is a diagram illustrating an example of the layout data. The layout data 4 shown in FIG. 5 is the layout data in which the line and space pattern 3 of 5 μm×5 μm is the species cell. In the layout data 4, 250 pieces×250 pieces of the line and space patterns 3 are arrayed repeatedly in a vertical direction and a horizontal direction. Therefore, the layout data 4 has an area of 1250 μm×1250 μm. In the present embodiment, a case is explained in which the layout data 4 in which the line and space patterns 3 are repeatedly arrayed is the layout data for flare correction. In the present embodiment, a case is explained in which the layout data 4 is such that the line and space patterns 3 are repeatedly arrayed; however, when performing the flare correction of the layout data corresponding to a product pattern, the layout data is not limited to the layout data 4 shown in FIG. 5 and can be any layout data.

The layout data 4 is partitioned (divided) into 1 μm intervals to be meshed into 1250 pieces×1250 pieces. The flare map calculating unit 12 obtains the flare map by determining the pattern density of each divided mesh and convolving it with the PSF.

Figure 6:
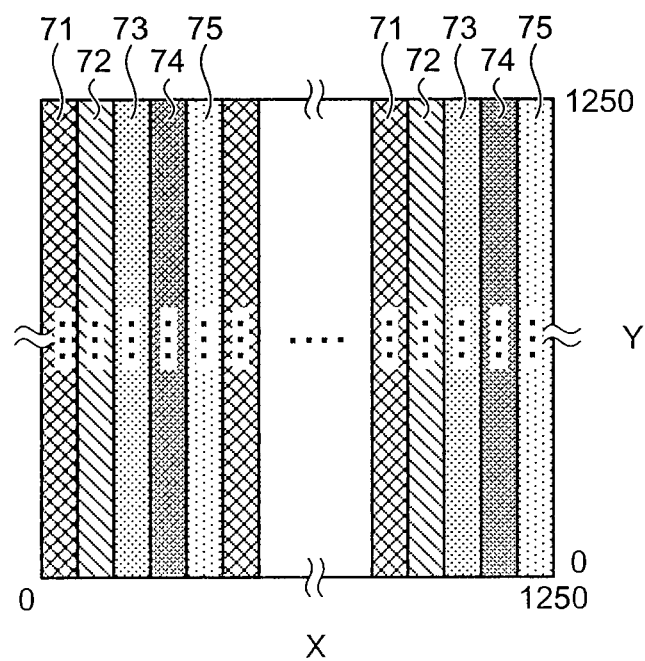
FIG. 6 is a diagram illustrating a pattern density map of the layout data divided into meshes.
Figure 7:
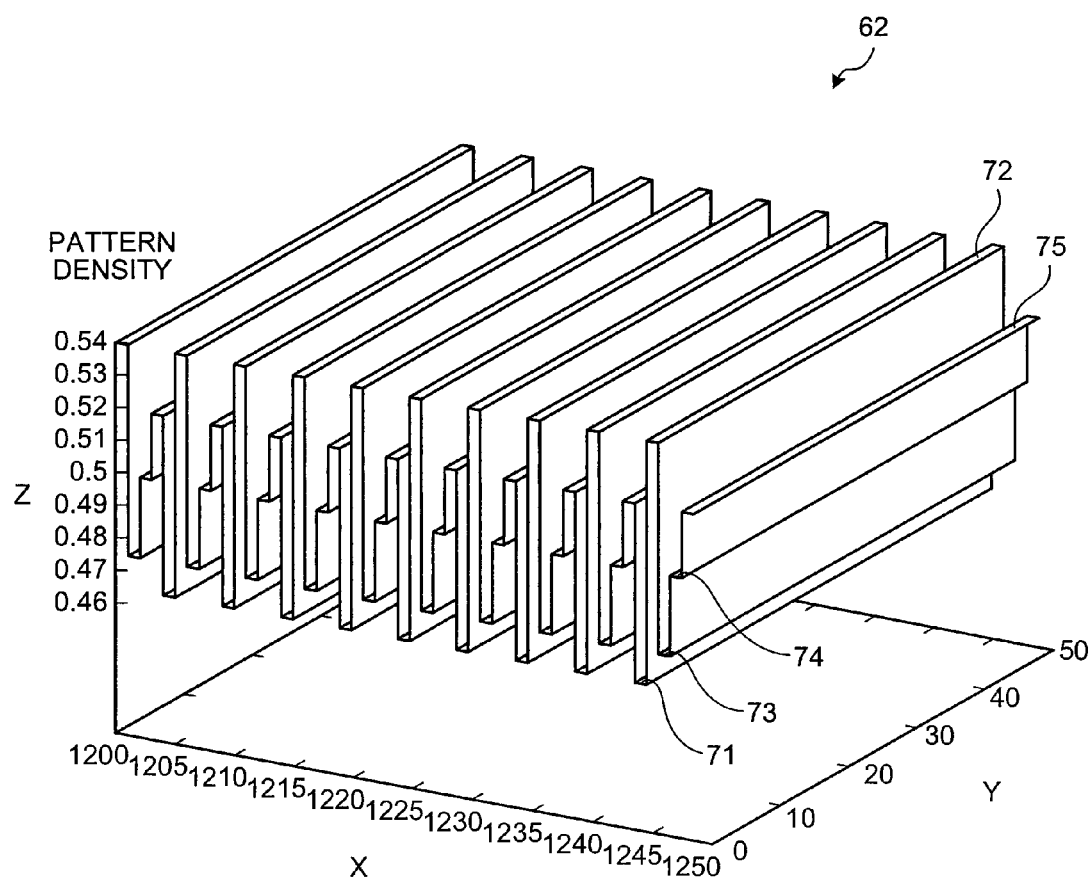
FIG. 7 is a diagram illustrating a partially-enlarged view of the pattern density map shown in FIG. 6.

FIG. 6 is a diagram illustrating a pattern density map of the layout data divided into the meshes. FIG. 7 illustrates the pattern density map that is a partially-enlarged view of the pattern density map shown in FIG. 6. FIG. 6 schematically illustrates a pattern density map indicating the pattern density of the whole layout data 4 shown in FIG. 5 as a top view. In FIG. 7, an area (X=1200 μm to 1250 μm, Y=0 μm to 50 μm) of 50 μm×50 μm in the pattern density map shown in FIG. 6 is enlarged and is schematically and three-dimensionally illustrated as a pattern density map 62. An X axis and a Y axis of the pattern density maps 61 and 62 correspond to an X direction and a Y direction of the layout data 4. A Z axis of the pattern density map 62 is the pattern density.

In the pattern density maps 61 and 62, areas 71 to 75 corresponding to values of the pattern density are distributed as rectangular areas parallel to the Y axis. The area 71 is an area in which the pattern density is the lowest (pattern density is about 0.46), and the area 75 is an area in which the pattern density is the second highest (pattern density is about 0.52). The area 74 is an area in which the pattern density is the third highest (pattern density is about 0.50), and the area 73 is an area in which the pattern density is the fourth highest (pattern density is about 0.48). The area 72 is an area in which the pattern density is the highest (pattern density is about 0.54). In the pattern density maps 61 and 62, the areas 71 to 75 are distributed repeatedly in the X direction in the order of the area 71, the area 75, the area 74, the area 73, and the area 72.

The distribution of one pair composed of the area 71, the area 75, the area 74, the area 73, and the area 72 in the x direction corresponds to one line and space pattern 3. In other words, in the line and space pattern 3 of 5 μm×5 μm, respective ones of the area 71, the area 75, the area 74, the area 73, and the area 72 are distributed. FIG. 7 illustrates the pattern density of the line and space patterns 3 of 10 pieces×10 pieces.

The pattern density repeats a high level and a low level to correspond to an arrangement cycle of the line and space patterns 3.

The flare map calculating unit 12 calculates the flare map, for example, by using Equation (1). In Equation (1), Flare (x,y) is the flare value at a mesh position (x,y) and Density (X,Y) is the pattern density at a mesh position (X,Y). Moreover, PSF (dist) is a PSF value (flare induced dose per unit area) at a distance dist, and Mesh_Area is a $$\text{flare}(x, y) = \sum_x \sum_y \left( \text{density}(X, Y) \times PSF\left(\sqrt{\overline{((X - x)^2 + (Y - y)^2)}}\right) \times \text{Mesh\_Area} \right) \quad (1)$$

Figure 8:
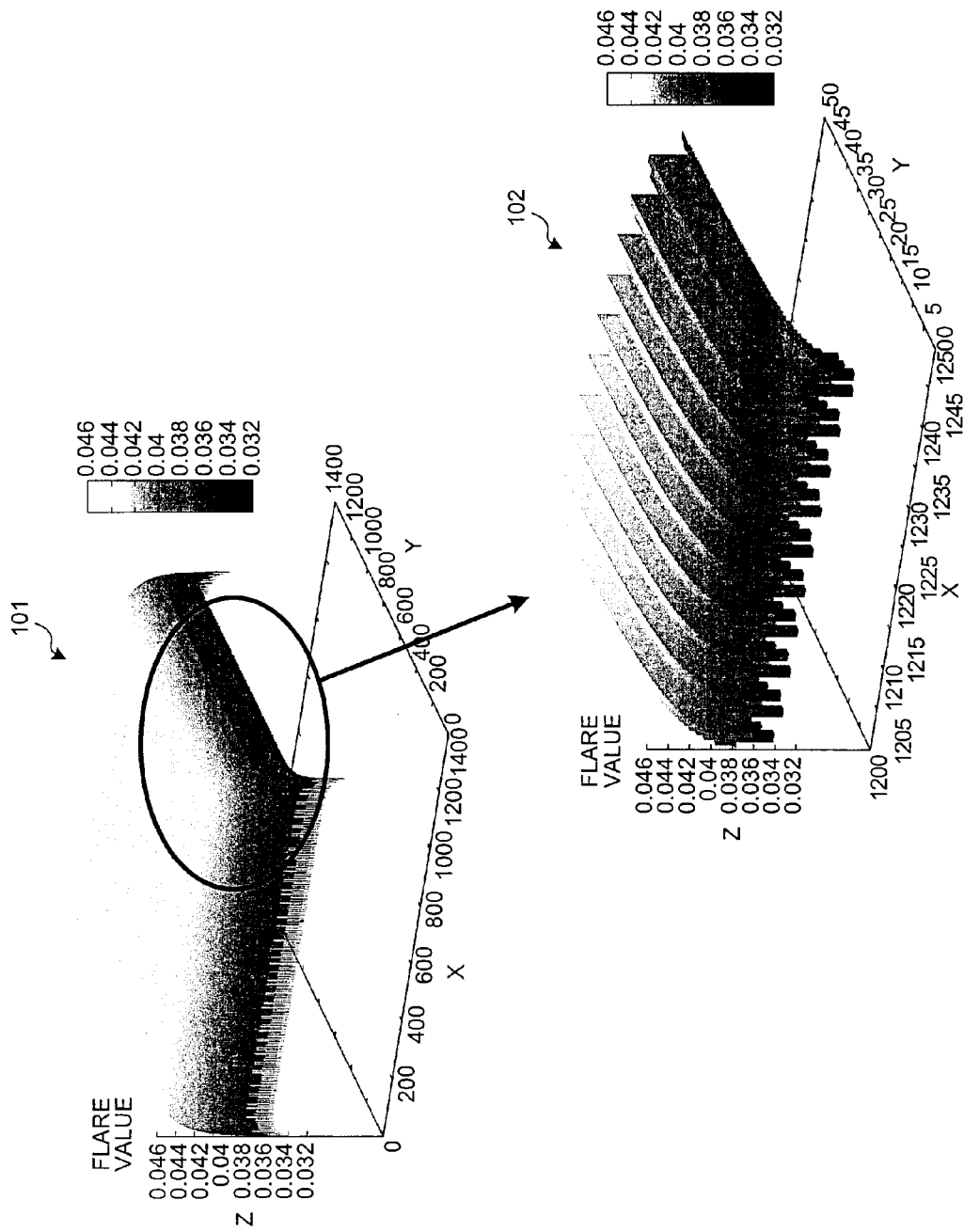
FIG. 8 is a diagram illustrating an example of a flare map.

The flare map calculating unit 12 calculates the flare map, for example, as shown in FIG. 8. FIG. 8 is a diagram illustrating an example of the flare map. In FIG. 8, a flare map 101 is illustrated on the upper left side and a flare map 102 is illustrated on the lower right side. An X axis and a Y axis of the flare maps 101 and 102 correspond to the X direction and the Y direction of the layout data 4. A Z axis of the flare maps 101 and 102 is the flare value. The flare map 101 is the flare map indicating the flare value of the whole layout data 4 and the flare map 102 is the flare map in which the area (X=1200 μm to 1250 μm, Y=0 μm to 50 μm) of 50 μm×50 μm in the flare map 101 is enlarged and illustrated.

Figure 9:
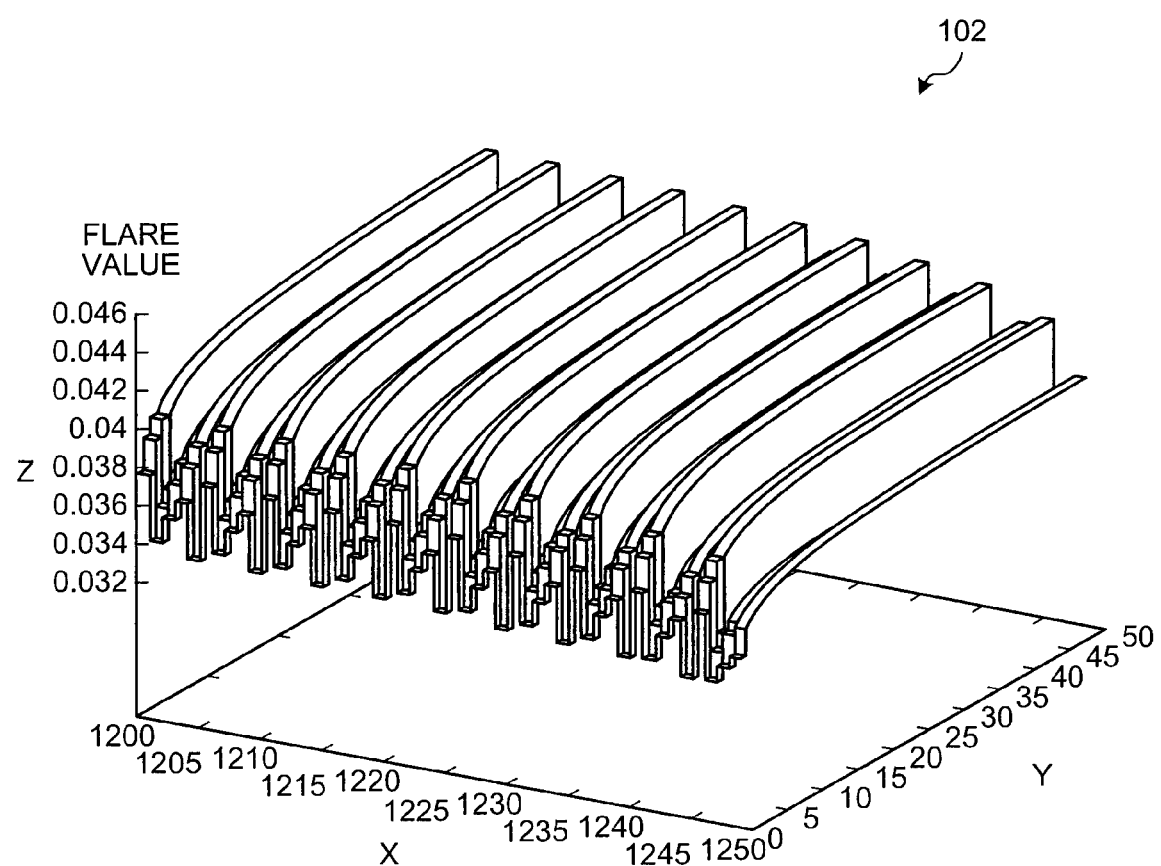
FIG. 9 is a diagram schematically illustrating the flare map shown in FIG. 8.

FIG. 9 is a diagram schematically illustrating the flare map shown in FIG. 8. In FIG. 9, the flare map 102 is schematically and three-dimensionally illustrated. In the flare maps 101 and 102, the flare value becomes smaller as the flare map approaches around X=0, around X=1250 μm, around Y=0, and around Y=1250 μm. In other words, the flare value becomes smaller as the flare map approaches around a peripheral portion at a portion corresponding to around the peripheral portion of the layout data 4.

In a conventional method, a bias amount 0 (flare correction amount 0) is set at the time of the flare value 0 based on the flare map, and the flare correction is performed by resizing the pattern in accordance with the flare value. However, if the flare correction is performed on a pattern edge by −1 nm per 1 percent of the flare value, when the flare map 101 is used, the maximum flare value is 4.6%, so that the maximum correction amount of the flare correction is −4.6 nm. Therefore, in the conventional method, in the case of the line pattern of 40 nm, the pattern after the correction becomes the line pattern of 30.8 nm, so that a mask creation and a mask inspection may become difficult.

Figure 10:
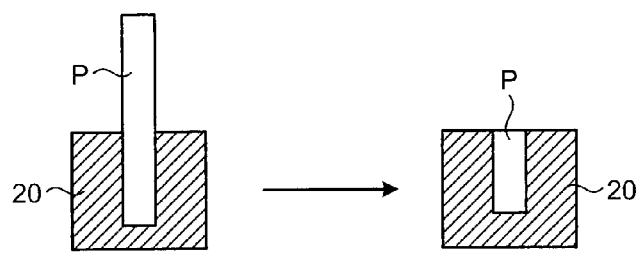
FIG. 10 is a diagram conceptually illustrating a calculation process according to the first embodiment of area occupancy.

Thus, in the present embodiment, a flare reference value for which the bias amount is 0 is determined as the reference flare value, and the flare correction is performed by using this reference flare value. Specifically, first, the flare occupancy calculating unit 13 calculates an area occupancy for each flare value (small section representing a range of the flare value) divided for each predetermined flare value range (Step S30). FIG. 10 is a diagram conceptually illustrating a calculation process according to the first embodiment of the area occupancy. For example, as shown in FIG. 10, the flare occupancy calculating unit 13 calculates an area of a pattern P in a mesh of flare map (flare mesh) 20 by ANDing the pattern P and the mesh (flare mesh 20) having a predetermined flare value and calculates the area occupancy by using the area of the pattern P in the flare mesh 20.

Figure 11:
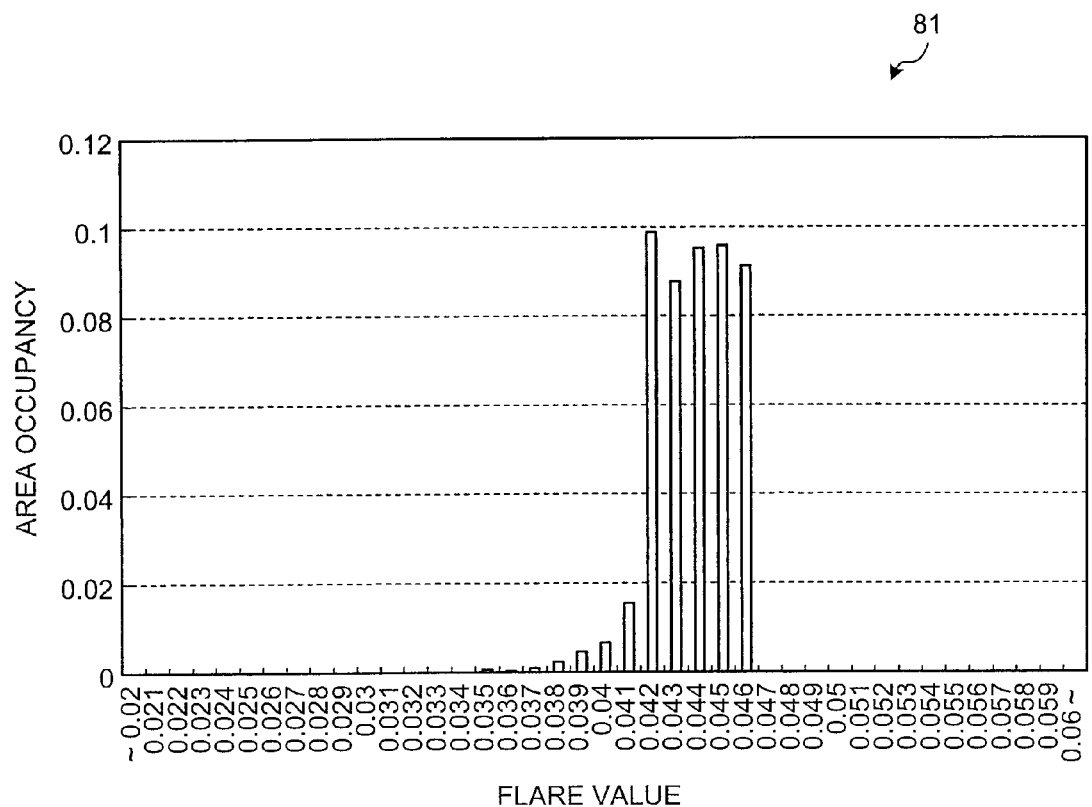
FIG. 11 is a diagram illustrating a relationship between a flare value calculated by the flare correction method according to the first embodiment and the area occupancy.

The flare occupancy calculating unit 13 calculates the area occupancy by dividing the flare value into 0.001 (0.1%) units and generates, for example, a distribution (histogram 81) as shown in FIG. 11 by using the calculated area occupancy. FIG. 11 is a diagram illustrating a relationship between the flare value calculated by the method of correcting a flare according to the first embodiment and the area occupancy. In FIG. 11, a horizontal axis indicates the flare value and the vertical axis indicates the area occupancy.

The vertical axis is the area occupancy in the present embodiment; however, it is also considered as another method to determine a change rate of a correction bias when a temporarily-determined reference flare value is changed and take a value (i.e., pattern change rate by correction) obtained by multiplying the change rate of the correction bias by the area occupancy as the vertical axis. Specially, when there is no linear relationship between the flare value and the correction amount, the pattern change rate after the correction is not necessarily made small by evaluation of only the area or a later-described edge occupancy. The reference flare value can be determined more accurately by employing this evaluation method.

Figure 12:
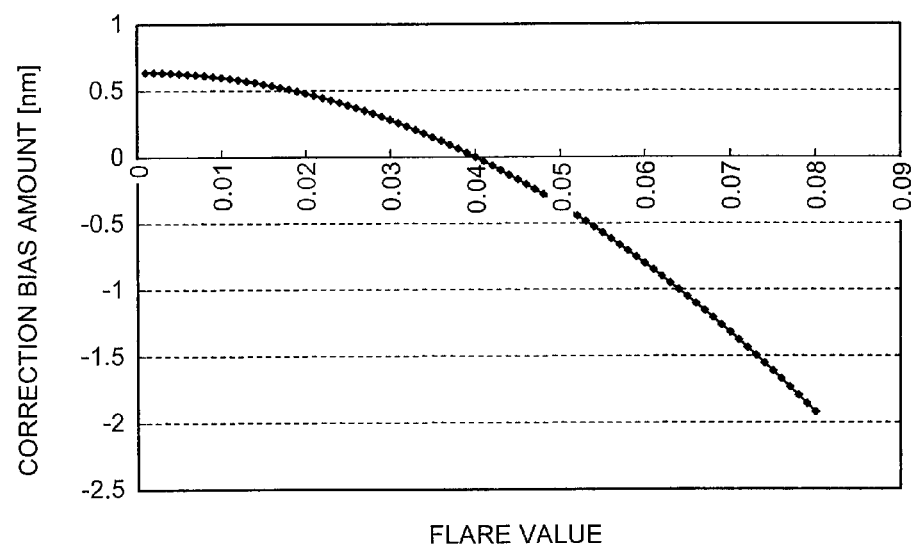
FIG. 12 is a diagram illustrating a correction bias amount when the correction bias amount does not have a linear relationship with respect to the flare value.

Explanation is given by way of a specific example. FIG. 12 is a diagram illustrating a correction bias amount when the correction bias amount does not have a linear relationship with respect to the flare value. FIG. 12 represents the correction bias amount with respect to the flare value when the reference flare value is temporarily set to 4%. As shown in FIG. 12, the case actually exists in which the correction bias amount does not have a linear relationship with respect to the flare intensity. In such a case, an operation (occupancy×Δ correction amount) is performed for each flare value shown in FIG. 11, in which the occupancy is multiplied by a change amount (Δ correction amount) of the correction bias amount when the flare reference value is changed. The result thereof is shown in FIG. 13.

Figure 13:
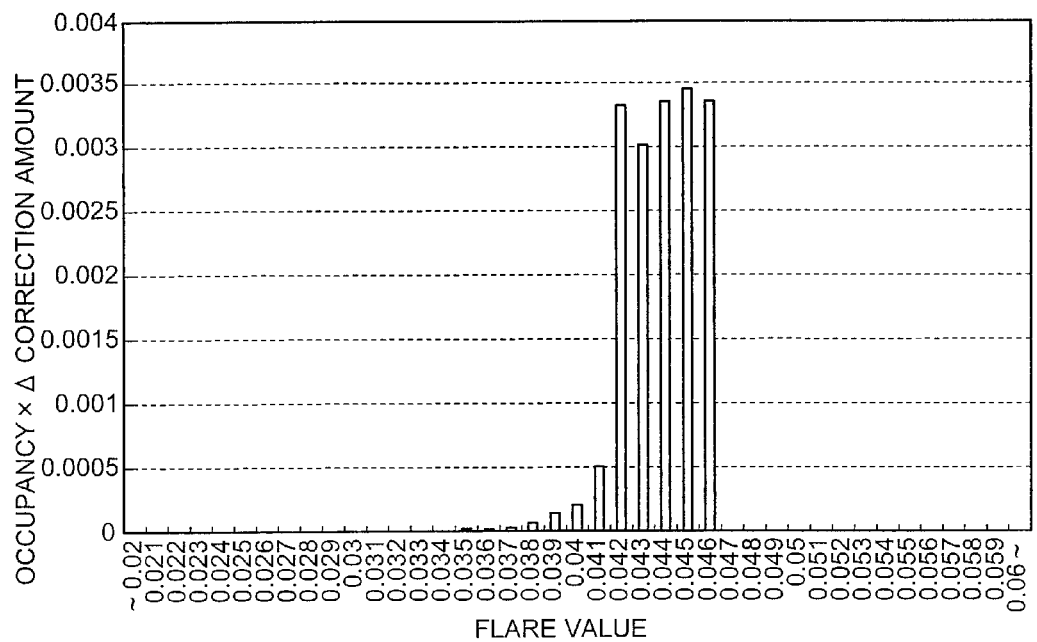
FIG. 13 is a diagram illustrating a relationship between a value, which is obtained by multiplying occupancy by a Δ correction amount, and the flare value.

FIG. 13 is a diagram illustrating a relationship between a value, which is obtained by multiplying the occupancy by the Δ correction amount, and the flare value. In FIG. 13, the horizontal axis indicates the flare value and the vertical axis indicates (occupancy×Δ correction amount). The occupancy in this example can be the area occupancy or a pattern-edge occupancy to be described later. The graph shown in FIG. 13 represents the degree of the change of the correction amount area at each flare value with respect to the change of the reference flare value. A portion (around 0.045 in this example) at which (occupancy×Δ correction amount) is large in the graph shown in FIG. 13 is set as the reference flare value, so that a correction-amount change amount can be suppressed small.

Moreover, as still another method, it is applicable to perform an operation (occupancy×correction amount) of multiplying the occupancy by the correction value (correction bias amount) itself for each flare value shown in FIG. 11. The result thereof is shown in FIG. 14.

Figure 14:
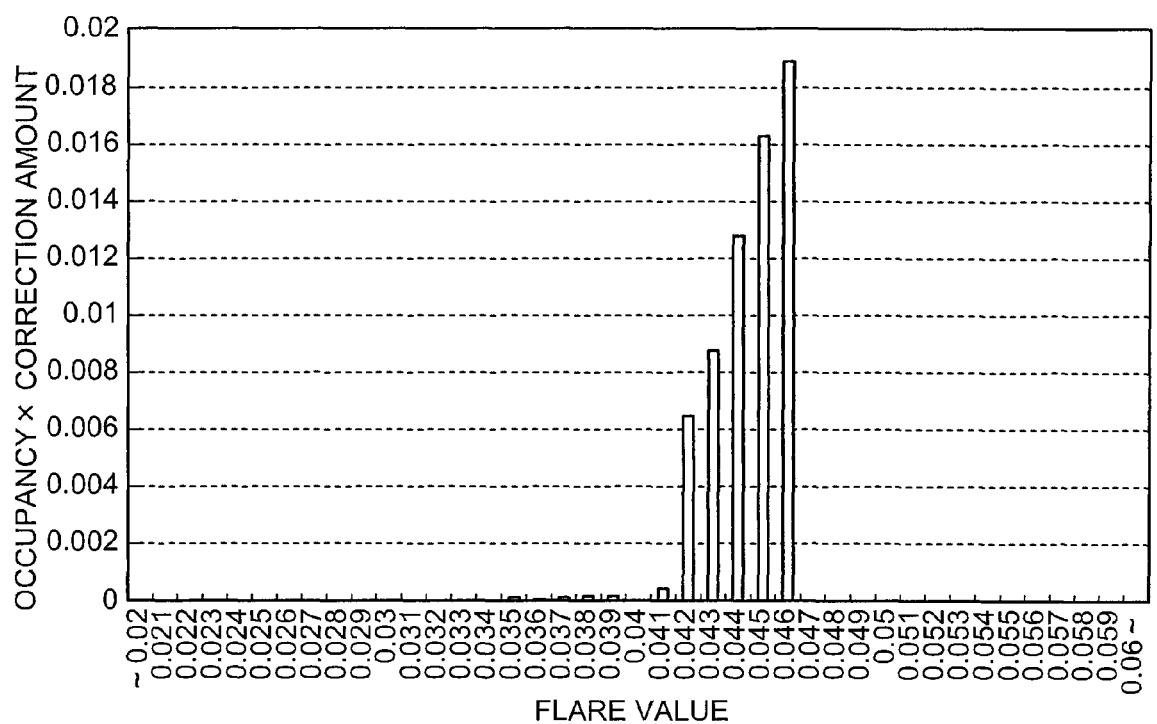
FIG. 14 is a diagram illustrating a relationship between a value, which is obtained by multiplying the occupancy by a correction amount, and the flare value.

FIG. 14 is a diagram illustrating a relationship between a value, which is obtained by multiplying the occupancy by the correction amount, and the flare value. In FIG. 14, the horizontal axis indicates the flare value and the vertical axis indicates (occupancy×correction amount). The occupancy in this example can be the area occupancy or the pattern-edge occupancy to be described later. The graph shown in FIG. 14 represents the degree of the correction-amount change amount for each flare value with respect to the temporarily-determined reference flare value. A portion (around 0.046 in this example) at which (occupancy×correction amount) is large in the graph shown in FIG. 14 is set as the reference flare value, so that the correction-amount change amount can be suppressed small. Moreover, because a total of the values on the vertical axis represents a value having a meaning equivalent to a total amount of a correction change area by using the relationship shown in FIG. 14, an optimum reference flare value can be determined by employing a method such as iteration to minimize this total value.

The reference-flare-value determining unit 14 analyzes the histogram 81 generated by the flare occupancy calculating unit 13 and determines the reference flare value for which the flare correction amount is 0 (Step S40). For example, the reference-flare-value determining unit 14 determines the flare value whose area occupancy is the highest in the distribution of the flare value as the reference flare value. In other words, the flare value with the highest frequency in the histogram 81 is determined as the reference flare value.

For example, in the case of the histogram 81 shown in FIG. 11, 0.042 (4.2%) that is the flare value with the highest area occupancy is set as the reference flare value. The reference flare value is not always need to be the value with the maximum area occupancy and, for example, it is applicable to set the flare value positioned around the center of the flare value area, in which the distribution having higher area occupancies than a predetermined value is concentrated, as the reference flare value. In other words, it is applicable to set the flare value indicating approximately an intermediate value between the flare value indicating the maximum value of the area occupancy and the flare value indicating the minimum value of the area occupancy as the reference flare value in the distribution of the area occupancy. In the case of the histogram 81 shown in FIG. 11, because the flare value area in which the distribution is concentrated is 0.042 (4.2%) to 0.046 (4.6%), the flare value of 0.044 (4.4%) at the intermediate position thereof can be selected as the reference flare value.

Moreover, as another method, the reference-flare-value determining unit 14 can determine the flare value corresponding to around the middle between the maximum flare value and the minimum flare value in the histogram 81 as the reference flare value. Whereby, the maximum correction amount can be made smallest, so that the correction accuracy in the pattern whole surface can be improved. In the case of the histogram 81 shown in FIG. 11, because the range is 0.35 to 0.046, the flare correction of 0.6 nm is performed at a maximum by setting the flare value of 0.04 at the intermediate position thereof as the reference flare value.

Furthermore, the reference-flare-value determining unit 14 can set the flare value that is around the middle of the maximum flare value and the minimum flare value in the histogram 81 and has a high area occupancy as the reference flare value. Whereby, it is possible to suppress the change amount of the pattern due to the correction small while suppressing the maximum correction amount to the pattern.

Moreover, the reference-flare-value determining unit 14 can set the flare value corresponding to an average position (gravity center position) in the distribution in the histogram 81 as the reference flare value. Whereby, an overall correction area fluctuation can be made small. Furthermore, the reference-flare-value determining unit 14 can select the reference flare value by combining the above determination methods of the reference flare value. For example, the reference-flare-value determining unit 14 determines a plurality of the reference flare values by using a plurality of the above determination methods of the reference flare value. Then, the reference-flare-value determining unit 14 determines the average or the like of the determined reference flare values as the reference flare value. A predetermined method can be set to the reference-flare-value determining unit 14 in advance as the determination method of the reference flare value or the determination method of the reference flare value can be changed in accordance with instruction information from a user input from the input unit 10.

Furthermore, when the flare reference value is changed, it is assumed that, because exposure is performed by changing a reference exposure dose, an exposure margin (allowable range of exposure dose fluctuation or focus fluctuation) cannot be ensured enough. In this case, the reference flare value is determined within the flare value range in which sufficient (a predetermined value or more) exposure margin can be ensured.

Moreover, the flare correction apparatus 1 can divide the layout data 4 into a plurality of areas and determine the reference flare value with respect to each area after the division. In this case, the average of the reference flare values determined for respective areas is determined as the reference flare value.

In the present embodiment, the reference-flare-value determining unit 14 selects 0.042 (4.2%) that is the flare value with the highest area occupancy as the reference flare value. Thereafter, the pattern correcting unit 15 performs the bias correction on the pattern with the determined reference flare value as a reference (correction bias amount 0). Specifically, the layout data 4 in the storage unit 11 is subjected to the flare correction (pattern correction) by −1 nm per 1% with the reference flare value (4.2%) as a reference (Step S50). The correction method by a pattern resizing process is used as a typical method for the method of biasing the layout data 4 and performing the flare correction on the layout data 4. For example, when the reference flare value is 0.042, the pattern having the flare value of 0.043 is subjected to the flare correction to be thinned by 0.1 nm, and the pattern having the flare value of 0.044 is subjected to the flare correction to be thinned by 0.2 nm. The pattern having the flare value of 0.041 is subjected to the flare correction to be thickened by 0.1 nm, and the pattern having the flare value of 0.04 is subjected to the flare correction to be thickened by 0.2 nm. In the manner, the flare correction apparatus 1 automatically determines the reference flare value without interposing determination by a user in a series of process flow and performs the flare correction.

FIG. 15 is a diagram illustrating an effect when the flare correction is performed by the method of correcting a flare according to the first embodiment. FIG. 15 illustrates the degree of the change of the flare correction amount in the layout area (change rate of the layout area when the flare correction is performed) as result information 51. Specifically, FIG. 15 illustrates a correction change rate (change rate of the pattern area) in a case of performing the flare correction in accordance with the flare value without providing the reference flare value (bias is 0 when the flare value is 0) (conventional method) and the correction change rate in a case of determining the reference flare value and performing the flare correction (method of correcting a flare in the present embodiment). In the correction change rates in FIG. 15, the conventional method is indicated as "without reference" and the method of correcting a flare in the present embodiment is indicated as "reference 4.2%". The correction change rate in the case of "without reference" is 4.3%, whereas the correction change rate in the case of "reference 4.2%" is 0.2%.

In this manner, when the flare correction is performed without providing the reference flare value, the shape is changed about 4.3% from the original layout pattern before the correction. On the other hand, in the method of correcting a flare in the present embodiment, the shape change can be suppressed to 0.2%. Therefore, in the method of correcting a flare in the present embodiment, the flare correction can be performed on the layout data 4 without substantially deforming from the original pattern. Whereby, the flare correction can be performed with high accuracy while suppressing difference from the original pattern as little as possible. Thus, a phenomenon in which the pattern deformation occurs due to the effect of variation in density around the pattern can be solved by the flare correction in manufacturing a semiconductor integrated circuit.

After the flare correction of the layout data 4 is performed, a photomask is manufactured by using the layout data 4 after the flare correction. Then, a semiconductor device (semiconductor integrated circuit) is manufactured by using the photomask in a wafer process. Specifically, an exposure apparatus performs an exposure process on a wafer by using the photomask, and thereafter, a development process and an etching process of the wafer are performed. The semiconductor device is manufactured by performing the flare correction of the layout data 4 and manufacturing of the photomask for each layer and repeating the exposure process, the development process, the etching process, and the like for each layer.

In the present embodiment, a case is explained in which the flare correction of the layout data 4 is performed as the correction process of the pattern data; however, the flare correction of patterns of mask data or a lithography target can be performed as the correction process of the pattern data. In this case, the reference flare value is calculated by using the mask data or the lithography target, and the flare correction of the mask data or the lithography target is performed by using the calculated reference flare value.

Moreover, in the present embodiment, the reference flare value is calculated by using the histogram 81; however, the histogram 81 is not the only choice and the reference flare value can be calculated by using other information indicating a relationship between the flare value and the area occupancy.

In this manner, according to the first embodiment, the flare value with the highest area occupancy is set as the reference flare value and the flare correction is performed based on this reference flare value, so that the flare correction of eliminating the effect of the flare can be accurately performed in a short time. The time can be shortened because of the shortened bias process due to less correction amount and no interposition of a user due to the systematic determination of the reference flare value.

Moreover, when the flare value with the highest area occupancy in the histogram 81 is set as the reference flare value (flare correction amount 0), the area fluctuation before and after the correction can be suppressed small in the whole surface of the pattern (layout data 4).

Furthermore, when the flare value corresponding to around the middle between the maximum flare value and the minimum flare value in the histogram 81 is set as the reference flare value, the maximum correction amount can be made smallest, so that all of the flare corrections can be compensated with high accuracy.

Moreover, when the flare value that is around the middle of the maximum flare value and the minimum flare value in the histogram 81 and has a high area occupancy is set as the reference flare value, the deformation amount of the pattern can be suppressed small while suppressing the maximum correction amount to the pattern.

Furthermore, when the flare value corresponding to the average position in the distribution in the histogram 81 is set as the reference flare value, the area fluctuation before and after the correction can be suppressed small in the pattern whole surface.

Second Embodiment

Next, the second embodiment is explained with reference to FIG. 16 to FIG. 18. In the second embodiment, a critical pattern is extracted from the layout data 4 and the reference flare value is calculated by using the extracted critical pattern.

FIG. 16 is a flowchart illustrating a process procedure of a method of correcting a flare according to the second embodiment. In the processes shown in FIG. 16, redundant explanation is omitted for the procedure for performing the process similar to that in the method of correcting a flare according to the first embodiment shown in FIG. 3.

The layout data 4, the PSF, and the like are input in advance to the input unit 10 of the flare correction apparatus 1 (Step S110). The flare map calculating unit 12 calculates the flare map by using the layout data 4 (Step S120).

Thereafter, the flare occupancy calculating unit 13 extracts the critical pattern from the layout data 4 (Step S130). Specifically, the flare occupancy calculating unit 13 extracts the patterns having a predetermined line width or less, the patterns having a predetermined distance to adjacent pattern or less, or the pattern that is a combination thereof and meets a predetermined condition (condition of a critical dimension) from the layout data 4. The flare occupancy calculating unit 13, for example, extracts the patterns that are line patterns having the predetermined line width or less and has a space pattern having the predetermined distance to adjacent pattern or less as the critical patterns.

It is applicable that the flare occupancy calculating unit 13 calculates the exposure margin by experiment, simulation, or the like and extracts the pattern having a predetermined exposure margin or less as the critical pattern. Moreover, it is applicable that the flare occupancy calculating unit 13 extracts the pattern or the pattern area designated by a user as the critical pattern. Furthermore, it is applicable that the flare occupancy calculating unit 13 extracts a predetermined critical pattern by combining the above extraction methods of the critical pattern. In this manner, the flare occupancy calculating unit 13 in the present embodiment extracts the pattern that requires high accuracy in patterning as the critical pattern.

In the present embodiment, a case is explained in which the flare occupancy calculating unit 13 extracts a pattern portion having the line width of 50 nm or less as the critical pattern. The flare occupancy calculating unit 13 calculates the area occupancy distribution only with respect to the extracted critical pattern (Step S140).

Figures 17, 18:
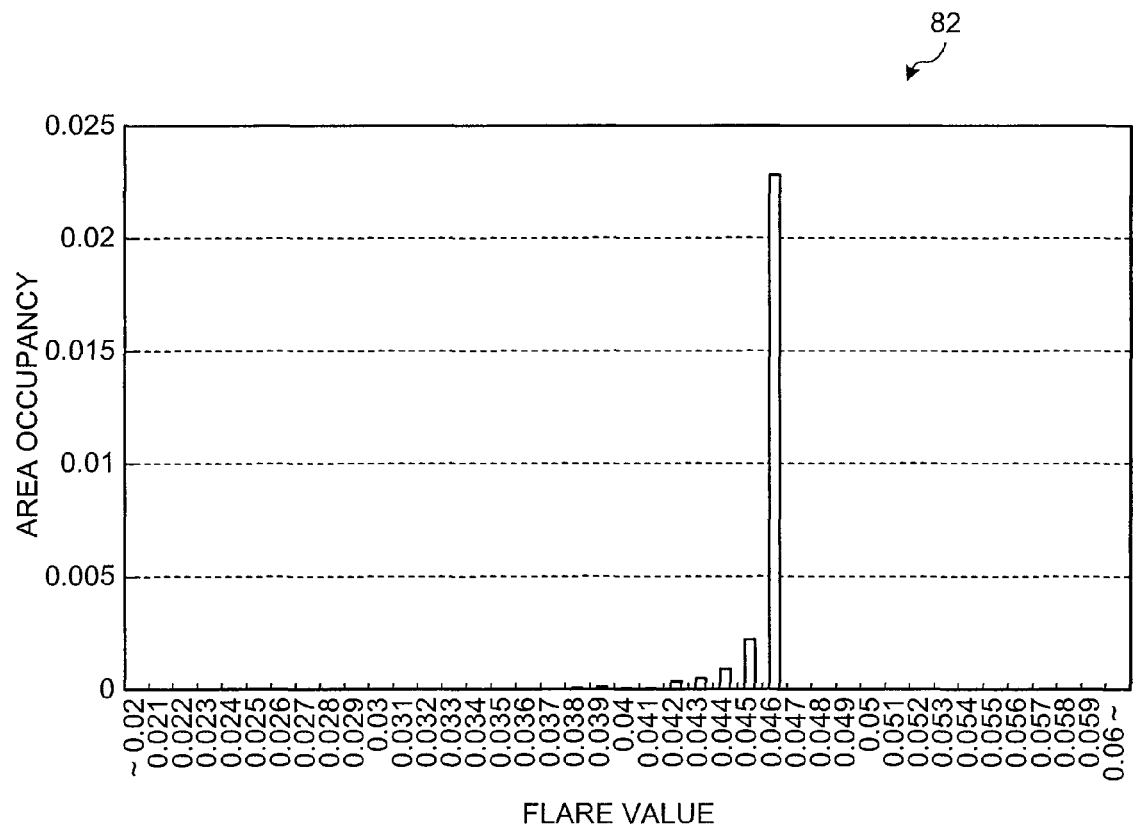
FIG. 17 is a diagram illustrating a relationship between the flare value calculated by the flare correction method according to the second embodiment and the area occupancy.
FIG. 18 is a diagram illustrating an effect when the flare correction is performed by the flare correction method according to the second embodiment.

The flare occupancy calculating unit 13 calculates the area occupancy by dividing the flare value into 0.001 (0.1%) units and generates, for example, a distribution (histogram 82) as shown in FIG. 17 by using the calculated area occupancy. FIG. 17 is a diagram illustrating a relationship between the flare value calculated by the method of correcting a flare according to the second embodiment and the area occupancy. In FIG. 17, a horizontal axis indicates the flare value and the vertical axis indicates the area occupancy.

The reference-flare-value determining unit 14 analyzes the histogram 82 generated by the flare occupancy calculating unit 13 and determines the reference flare value for which the flare correction amount is 0 (Step S150). The reference-flare-value determining unit 14 determines the reference flare value by the method similar to that in the first embodiment. For example, the reference-flare-value determining unit 14 determines a portion of 0.046 (4.6%) with the highest area occupancy as the reference flare value. Thereafter, the pattern correcting unit 15 performs the bias correction on the pattern with the determined reference flare value as a reference. Specifically, the layout data 4 in the storage unit 11 is subjected to the flare correction by −1 nm per 1% with the reference flare value (4.6%) as a reference (correction bias 0) (Step S160).

FIG. 18 is a diagram illustrating an effect when the flare correction is performed by the method of correcting a flare according to the second embodiment. In the similar manner to FIG. 15, FIG. 18 illustrates the degree of the change of the layout area by the flare correction as result information 52. In the correction change rates in FIG. 18, the conventional method is indicated as "without reference" and the method of correcting a flare in the present embodiment is indicated as "reference 4.6%". The correction change rate in the case of "without reference" is 4.3%, whereas the correction change rate in the case of "reference 4.6%" is 0.19%.

In this manner, when the flare correction is performed without providing the reference flare value, the shape is changed about 4.3% from the original layout pattern before the correction. On the other hand, in the method of correcting a flare in the present embodiment, the shape change can be suppressed to 0.19%. Therefore, in the method of correcting a flare in the present embodiment, the flare correction can be performed on the layout data 4 without substantially deforming from the original pattern. Specially, because the correction can be minimized with respect to the critical pattern, a high accurate correction can be performed compared with the case of calculating the reference flare value by using all of the patterns in the layout data 4.

In this manner, according to the second embodiment, because the reference flare value is calculated by using the critical pattern, correction to the critical pattern can be suppressed small. Therefore, the flare correction of eliminating the effect of the flare can be surely performed with high accuracy compared with the case of calculating the reference flare value by using all of the patterns in the layout data 4. Moreover, because the pattern that requires high accuracy in patterning is extracted as the critical pattern, the flare correction of the pattern that requires high accuracy in patterning can be surely performed with high accuracy.

Third Embodiment

Next, the third embodiment is explained with reference to FIG. 19 to FIG. 22. In the third embodiment, a pattern edge is extracted from the layout data 4 and a pattern edge occupancy is calculated by using the extracted pattern edge. Then, the reference flare value is calculated by using the calculated pattern edge occupancy.

Figure 19:
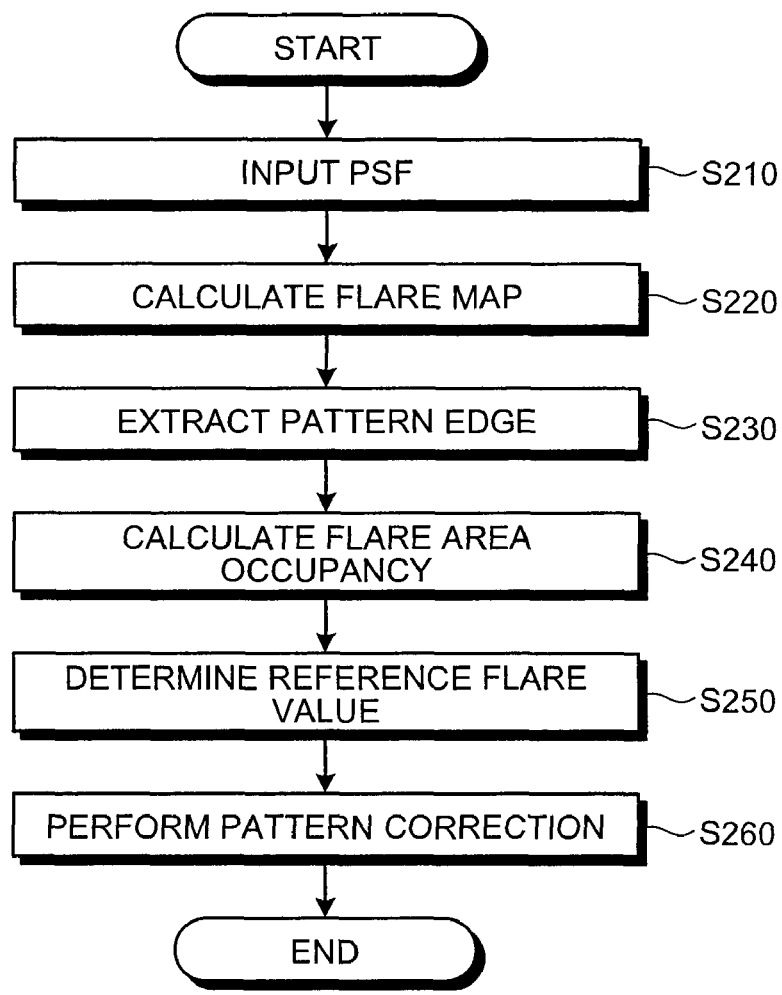
FIG. 19 is a flowchart illustrating a process procedure of a flare correction method according to a third embodiment.

FIG. 19 is a flowchart illustrating a process procedure of a method of correcting a flare according to the third embodiment. In the processes shown in FIG. 19, redundant explanation is omitted for the procedure for performing the process similar to that in the method of correcting a flare according to the first embodiment shown in FIG. 3.

The layout data 4, the PSF, and the like are input in advance to the input unit 10 of the flare correction apparatus 1 (Step S210). The flare map calculating unit 12 calculates the flare map by using the layout data 4 (Step S220).

Thereafter, the flare occupancy calculating unit 13 extracts the pattern edge from the layout data 4 (Step S230). Specifically, the flare occupancy calculating unit 13 extracts the pattern edge that overlaps with a flare mesh. The flare occupancy calculating unit 13 calculates the pattern edge occupancy for each flare value divided for each predetermined flare value range by using the pattern edge (Step S240). The pattern edge occupancy (flare occupancy) is occupancy of a pattern edge length for each flare value divided for each predetermined flare value range.

Figure 20:
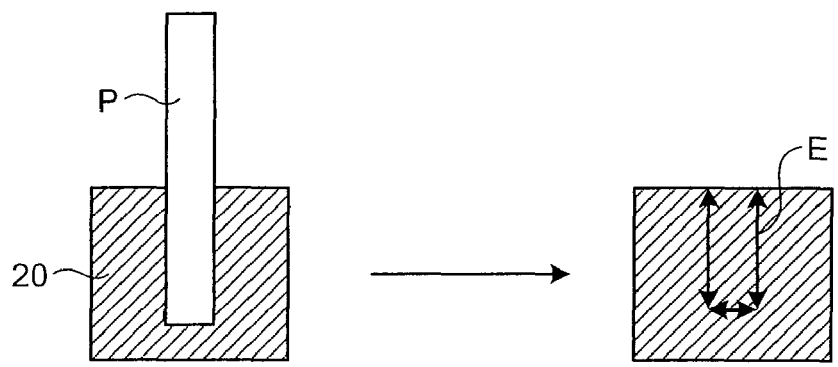
FIG. 20 is a diagram conceptually illustrating a calculation process according to the third embodiment of a pattern edge occupancy.

FIG. 20 is a diagram conceptually illustrating a calculation process according to the third embodiment of the pattern edge occupancy. For example, as shown in FIG. 20, the flare occupancy calculating unit 13 calculates the pattern edge length by ANDing a pattern edge E and a mesh (flare mesh 20) having a predetermined flare value and calculates the pattern edge occupancy by using the pattern edge length. Specifically, the flare occupancy calculating unit 13 extracts the pattern edge E overlapping with the flare mesh 20 and calculates the occupancy (ratio of the edge length of the pattern edge E with respect to the whole pattern length) of the edge length of the extracted pattern edge E as the pattern edge occupancy. In other words, the pattern edge occupancy is an edge length occupancy of the patterns having the predetermined flare value with respect to the whole pattern length of the pattern data. When calculating the pattern edge occupancy, in the present embodiment, the pattern edge occupancy is calculated by the method similar to that in the first embodiment while replacing the pattern edge E with the pattern having a width of 1 nm. In other words, the pattern edge E is converted into the pattern area with a width of 1 nm and the pattern edge occupancy is calculated, and the calculated area occupancy is set as the pattern edge occupancy.

Figures 21, 22:
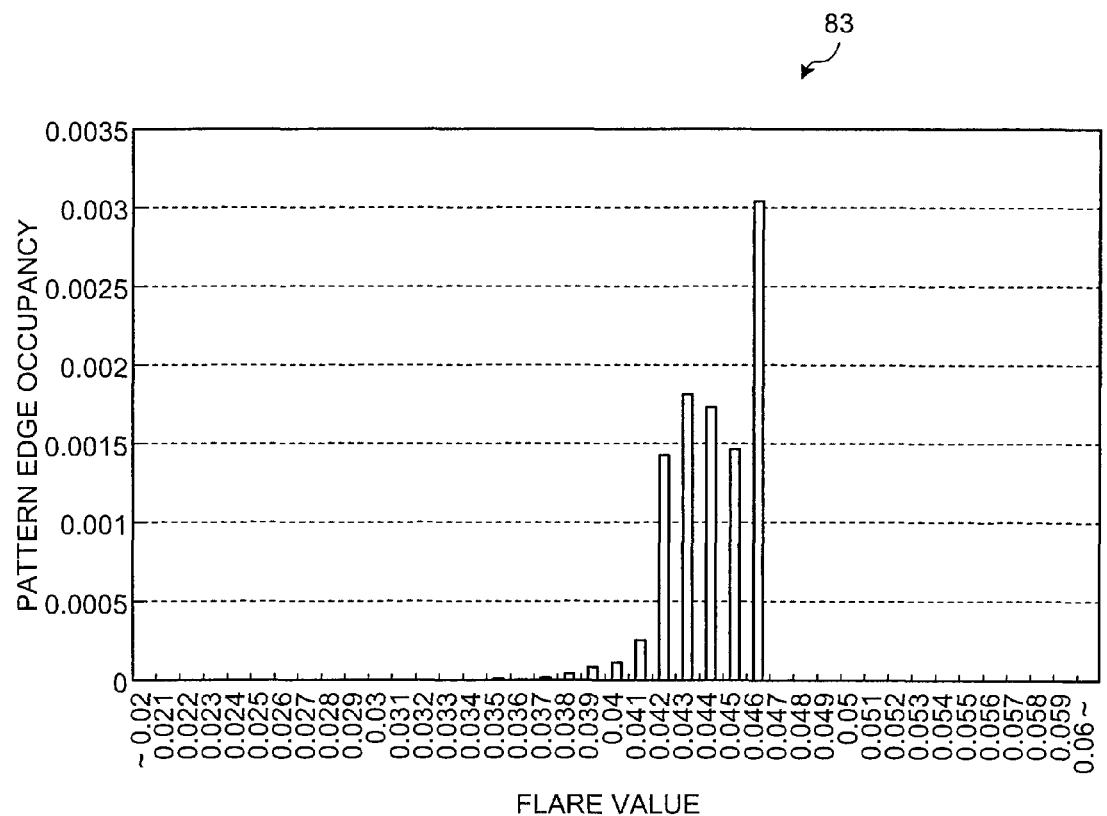
FIG. 21 is a diagram illustrating a relationship between the flare value calculated by the flare correction method according to the third embodiment and the pattern edge occupancy.
FIG. 22 is a diagram illustrating an effect when the flare correction is performed by the flare correction method according to the third embodiment.

The flare occupancy calculating unit 13 calculates the pattern edge occupancy by dividing the flare value into 0.001 (0.1%) units and generates, for example, a distribution (histogram 83) as shown in FIG. 21 by using the calculated pattern edge occupancy. Whereby, it is possible to quantitatively determine the degree of the pattern edge length occupied by each flare value on the layout data 4.

FIG. 21 is a diagram illustrating a relationship between the flare value calculated by the method of correcting a flare according to the third embodiment and the pattern edge occupancy. In FIG. 21, a horizontal axis indicates the flare value and the vertical axis indicates the pattern edge occupancy.

The reference-flare-value determining unit 14 analyzes the histogram 83 generated by the flare occupancy calculating unit 13 and determines the reference flare value for which the flare correction amount is 0 (Step S250). The reference-flare-value determining unit 14 determines the reference flare value by the method similar to that in the first embodiment. For example, the reference-flare-value determining unit 14 determines a portion of 0.046 (4.6%) with the highest pattern edge occupancy as the reference flare value. Thereafter, the pattern correcting unit 15 performs the bias correction on the pattern with the determined reference flare value as a reference. Specifically, the layout data 4 in the storage unit 11 is subjected to the flare correction by −1 nm per 1% with the reference flare value (4.6%) as a reference (Step S260).

FIG. 22 is a diagram illustrating an effect when the flare correction is performed by the method of correcting a flare according to the third embodiment. In the similar manner to FIG. 15, FIG. 22 illustrates the degree of the change of the layout area by the flare correction as result information 53. In the correction change rates in FIG. 22, the conventional method is indicated as "without reference" and the method of correcting a flare in the present embodiment is indicated as "reference 4.6%". The correction change rate in the case of "without reference" is 4.3%, whereas the correction change rate in the case of "reference 4.6%" is 0.19%.

In this manner, when the flare correction is performed without providing the reference flare value, the shape is changed about 4.3% from the original layout pattern before the correction. On the other hand, in the method of correcting a flare in the present embodiment, the shape change can be suppressed to 0.19%. Therefore, in the method of correcting a flare in the present embodiment, the flare correction can be performed on the layout data 4 without substantially deforming from the original pattern. Because the correction can be minimized with respect to the pattern edge, a high accurate correction can be performed compared with the case of calculating the reference flare value by using all of the patterns in the layout data 4.

The actual flare correction is performed on the pattern edge E, so that an appropriate flare correction conforming to the flare correction can be performed by determining the reference flare value based on the pattern edge occupancy.

In the similar manner to the second embodiment, it is applicable to calculate the pattern edge occupancy with respect to the pattern edge of the critical pattern and calculate the reference flare value by using the calculated pattern edge occupancy.

In this manner, according to the third embodiment, because the reference flare value is calculated by using the pattern edge E, correction to the pattern edge E can be suppressed small. Therefore, the flare correction of eliminating the effect of the flare can be surely performed with high accuracy compared with the case of calculating the reference flare value by using all of the patterns in the layout data 4.

The methods of correcting a flare explained in the first to third embodiments can be applied to a manufacturing method of a semiconductor device. In this case, a photomask is manufactured by using the layout data 4 after the flare correction. Then, the semiconductor device is manufactured by using the manufactured photomask. Moreover, the methods of correcting a flare explained in the first to third embodiments can be applied to a flare correction system using the flare correction apparatus 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a flare comprising:
receiving a pattern data corresponding to a pattern over a pattern area;
calculating a flare map based on the pattern data, wherein the flare map indicates a distribution of a plurality of flare values over the pattern area;
calculating a plurality of area occupancies by using the flare map, wherein each of the plurality area occupancies is based on an area corresponding to one of the plurality of flare values;
determining a reference flare value based on the plurality of area occupancies; and
performing a pattern correction based on the flare map and the reference flare value.

2. The method according to claim 1, wherein each of the plurality of area occupancies is based on a ratio of the area corresponding to one of the plurality of flare values divided by a total area of the pattern area.

3. The method according to claim 1, wherein the plurality of area occupancies include a plurality of pattern edge occupancies each indicating a ratio of the area corresponding to one of the plurality of flare values for an edge of the pattern divided by a total area of the pattern area, and the reference flare value is determined based on the plurality of pattern edge occupancies.

4. The method according to claim 1, wherein the reference flare value is a flare value corresponding to a maximum value of the plurality of area occupancies.

5. The method according to claim 1, further comprising determining a range of a flare values for which the corresponding area occupancies are higher than a predetermined value and further determining the reference flare value as a value of approximately a center in the range.

6. The method according to claim 1, further comprising determining a maximum area occupancy and a minimum area occupancy of the plurality of area occupancies and further determining the reference flare value as a flare value of the plurality of flare values for which the area occupancy is approximately an intermediate value between the maximum area occupancy and the minimum area occupancy value.

7. The method according to claim 1, wherein the reference flare value is a flare value for which the area occupancy is approximately an average of the plurality of area occupancies.

8. The method according to claim 1, wherein the reference flare value is approximately a weighted average of the plurality of the flare values wherein the plurality of area occupancies are used as weights in the weighted average.

9. The method according to claim 1, wherein the plurality of area occupancies include a plurality of critical pattern occupancies each indicating a ratio of the area corresponding to one of the plurality of flare values for a critical area of the pattern divided by a total area of the pattern area, and the reference flare value is determined based on the plurality of critical pattern occupancies.

10. The method according to claim 9, wherein the critical pattern is a pattern having a predetermined line width or less, a pattern having a predetermined distance to a adjacent pattern or less, or a pattern that is a combination thereof and meets a predetermined dimensional condition.

11. The method according to claim 9, wherein the critical pattern is a pattern whose exposure margin when forming a pattern corresponding to the pattern data is a predetermined value or less.

12. A method of manufacturing a photomask comprising manufacturing the photomask by using the method according to claim 1.

13. A method of manufacturing a semiconductor device comprising manufacturing the semiconductor device by using a photomask manufactured by the method according to claim 12.

14. The method according to claim 1, wherein in performing the pattern correction, a correction for each area of the pattern is based on the corresponding the flare value.

15. The method according to claim 14, wherein a correction for the reference flare value is set to zero.

16. A non-transitory computer-readable medium encoded with instructions executable by a computer, wherein the instructions, when executed by the computer, cause the computer to perform:

receiving a pattern data corresponding to a pattern over a pattern area;

calculating a flare map based on the pattern data, wherein the flare map indicates a distribution of a plurality of flare values over the pattern area;

calculating an occupancy of a pattern having a predetermined flare value on the pattern data as a flare value occupancy for each flare value, a plurality of area occupancies by using the flare map, wherein each of the plurality area occupancies is based on an area corresponding to one of the plurality of flare values;

determining a reference flare value based on the plurality of area occupancies; and performing a pattern correction based on the flare map and the reference flare value.

17. The non-transitory computer-readable medium according to claim 16, wherein each of the plurality of area occupancies is based on a ratio of the area corresponding to one of the plurality of flare values divided by a total area of the pattern area.

18. The non-transitory computer-readable medium according to claim 16, wherein the plurality of area occupancies include a plurality of pattern edge occupancies each indicating a ratio of the area corresponding to one of the plurality of flare values for an edge of the pattern divided by a total area of the pattern area, and the reference flare value is determined based on the plurality of pattern edge occupancies.

19. The non-transitory computer readable medium of claim 16, wherein in performing the pattern correction, a correction for each area of the pattern is based on the corresponding the flare value.

20. The non-transitory computer readable medium of claim 19, wherein a correction for the reference flare value is set to zero.

* * * * *